United States Patent
Ishibashi et al.

(10) Patent No.: US 6,335,867 B1
(45) Date of Patent: Jan. 1, 2002

(54) APPARATUS FOR INTERCONNECTING LOGIC BOARDS

(75) Inventors: Kenichi Ishibashi, Kokunji; Takehisa Hayashi, Sagamihara; Tsutomu Goto, Yokohama; Akira Yamagiwa, Kanagawa-ken; Tsuyoshi Watanabe, Machida, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/708,594

(22) Filed: Nov. 9, 2000

Related U.S. Application Data

(63) Continuation of application No. 09/128,779, filed on Aug. 4, 1998, now Pat. No. 6,163,464.

(30) Foreign Application Priority Data

Aug. 8, 1997 (JP) ............................................ 9-214396

(51) Int. Cl.[7] .............................................. H05K 01/14
(52) U.S. Cl. ....................... 361/788; 361/803; 361/686; 439/59; 439/61; 439/62; 174/261
(58) Field of Search ................................ 361/788, 796, 361/733, 803, 679, 686, 777, 791; 439/61, 62, 59; 174/261

(56) References Cited

U.S. PATENT DOCUMENTS

| | | | |
|---|---|---|---|
| 4,838,798 A | * | 6/1989 | Evans et al. ................... 439/61 |
| 5,023,754 A | | 6/1991 | Aug et al. |
| 5,091,822 A | | 2/1992 | Takahima |
| 5,119,273 A | | 6/1992 | Corda |
| 5,296,748 A | * | 3/1994 | Wicklund et al. ........ 307/303.1 |
| 5,488,541 A | | 1/1996 | Mistry et al. |
| 5,603,044 A | | 2/1997 | Annapareddy et al. |
| 5,650,757 A | | 7/1997 | Barber |
| 5,696,667 A | | 12/1997 | Berding |
| 5,982,634 A | | 11/1999 | Wronski |
| 6,163,464 A | * | 12/2000 | Ishibashe et al. ........... 361/788 |
| 6,181,570 B1 | * | 1/2001 | Ellebrecht et al. .......... 361/797 |

FOREIGN PATENT DOCUMENTS

JP 62-204359 9/1987

OTHER PUBLICATIONS

"Multiprocessor Features of the HP Corporate Business Servers", CONPCON Spring '93, Digest of Technical Papers, Feb. 1993, K. Chan et al, pp. 330–337.

* cited by examiner

Primary Examiner—Leo P. Picard
Assistant Examiner—David Foster
(74) Attorney, Agent, or Firm—Mattingly, Stanger & Malur, P.C.

(57) ABSTRACT

Apparatus for interconnecting logic boards is provided with a backplane, a plurality of logic boards connected to the backplane, and a plurality of interconnecting boards, connected to the backplane, for interconnecting the plurality of logic boards. In the apparatus, the plurality of logic boards are connected to the backplane with the logic boards in vertical position at right angles with the interconnecting boards and a specified distance away from the interconnecting boards.

10 Claims, 8 Drawing Sheets

APPARATUS FOR INTERCONNECTING LOGIC BOARDS

This is a continuation application of U.S. Ser. No. 09/128,779, filed Aug. 4, 1998. U.S. Pat. No. 6,163,464.

BACKGROUND OF THE INVENTION

The present invention relates to apparatus for interconnecting logic boards, which is preferably applicable to equipment for transmitting signals at high speed between a plurality of logic boards through the intermediary of interconnecting boards.

Apparatuses for transmitting signals between a plurality of logic boards through a backplane and interconnecting boards have been adopted in computers and switchboards. For example, computers, such as a workstation for transmitting signals between logic boards through bus wires provided on a backplane to which a plurality of logic boards, including a processor, memories, I/O devices are connected, are disclosed in pp. 330–337 of Digest of Technical Papers (issued in February, 1993) of CONPCON 93. In the connection method along the bus, the number of signals which are input or output through a logic board ranges from several bytes to ten odd bytes (8 bytes for example). The transfer frequency is in a range of 30 to no more than 80 MHz. This is due to high load because of a plurality of logic boards being connected to the bus wires and also due to the difficulty in increasing the transfer frequency owing to the disorder of waveform caused by reflections from each logic board.

With the increase in the operation frequency of the processors and also with the progress in multiprocessing, the throughput of data transfer becomes insufficient so long as the bus connection method is used. To solve this problem, it is required to adopt the switch connection method. To give an example, the switch connection method is to provide interconnecting boards, form a switch by LSI (semiconductor integrated circuit device) on each interconnecting board, and transmit signals between the logic boards through the intermediary of switches. In this switch connection method, it is possible to make a one-to-one connection between the logic LSI's on the logic boards and the switch LSI's on the interconnecting boards, thereby improving the transfer frequency to higher than 100 MHz. Apparatus for transmitting signals between a plurality of logic boards through interconnecting boards is disclosed U.S. Pat. No.5, 122,691. The above-mentioned known example is shown in FIG. 7, in which reference numerals 5a, 5b denote logic boards, 76b denotes a logic LSI mounted on a logic board 5b, and a similar LSI is mounted also in a logic board 5a. Numeral 76b denotes a connector for connecting the logic board 5b to the interconnecting boards 72g to 72j. Numeral 74g denotes an interconnecting LSI, mounted on an interconnecting board, which forms a switch for example. One each of the same LSI is mounted on the interconnecting boards 72h to 72j. In this prior-art example, logic boards 5 are directly connected to the interconnecting boards 72 without intervention of a backplane, and the logic boards 5 and the interconnecting boards 72 exchange signals through pins of the connector 76 at the intersections of the logic boards 5 and the interconnecting boards 72. Accordingly, there are a limited number of pins connecting the logic boards to a single interconnecting board 72 (3 pins in an embodiment of U.S. Pat. No. 5,122,691, of which 2 pins are for signals). Therefore, in order to transfer data of 8 bytes (64 bits) per logic board, more than 30 interconnecting boards are required, which results in the first problem of difficulty in mounting and assembling those boards and hence a high production cost.

When the switch connection method is adopted to improve throughput, there arise the following problems. As the transfer frequency improves, it becomes impossible to transfer data in one cycle, so that it will become necessary to adopt a method of transferring data in two or more cycles. In this case, it becomes necessary to equalize propagation delays in the transfer of data between the logic boards and the interconnecting boards, and it becomes necessary to at least equalize wire lengths between the logic boards and the interconnecting boards. However, in the switch connection method, because there is a large number of wires used (the number of logic boards×the number of input and output signals per logic board), the second problem is that a large number of man-hours for design are required to equalize the length of all wires. Though JP-A-62-204359 discloses the necessity to equalize the wire lengths in the transfer method as mentioned above, it does not disclose a wiring method.

SUMMARY OF THE INVENTION

It is an object of the present invention to solve the first and the second problems and provide a logic board interconnection apparatus which realizes low cost and high reliability and high-speed signal transmission.

The first problem can be solved effectively by connecting the logic boards and the interconnecting boards to a backplane, transmitting signals through the connector pins other than at the intersections of the logic boards and the interconnecting boards, thereby increasing the number of signals that the interconnecting boards couple to the backplane and decreasing the number of the interconnecting boards used. The second problem can be solved effectively by connecting all logic boards to the backplane with the logic boards in vertical position, that is, at right angles with the interconnecting boards and mutually spaced apart by a specified distance and so on. More specifically, by dividing connectors connecting the interconnecting boards and the backplane into regions of the number of the logic boards, allotting the divided regions to the logic boards in a designated order, dividing the connectors for connecting the logic boards and the backplane into regions of the number of the interconnecting boards, allotting the divided regions to the interconnecting boards in a designated order, and connecting the regions of the connectors for the interconnecting boards and the regions of the connectors for the logic boards on one-to-one correspondence by wires on the backplane, so that all wire lengths connecting the logic boards and the interconnecting boards can be equalized easily.

According to the present invention, in connection between the logic boards and the interconnecting boards, equilong wiring for data several bytes long can be done easily, which will contribute to lower cost, higher reliability and high-speed signal transmission.

DESCRIPTION OF THE PREFERRED EMBODIMENTS

Figure 1:
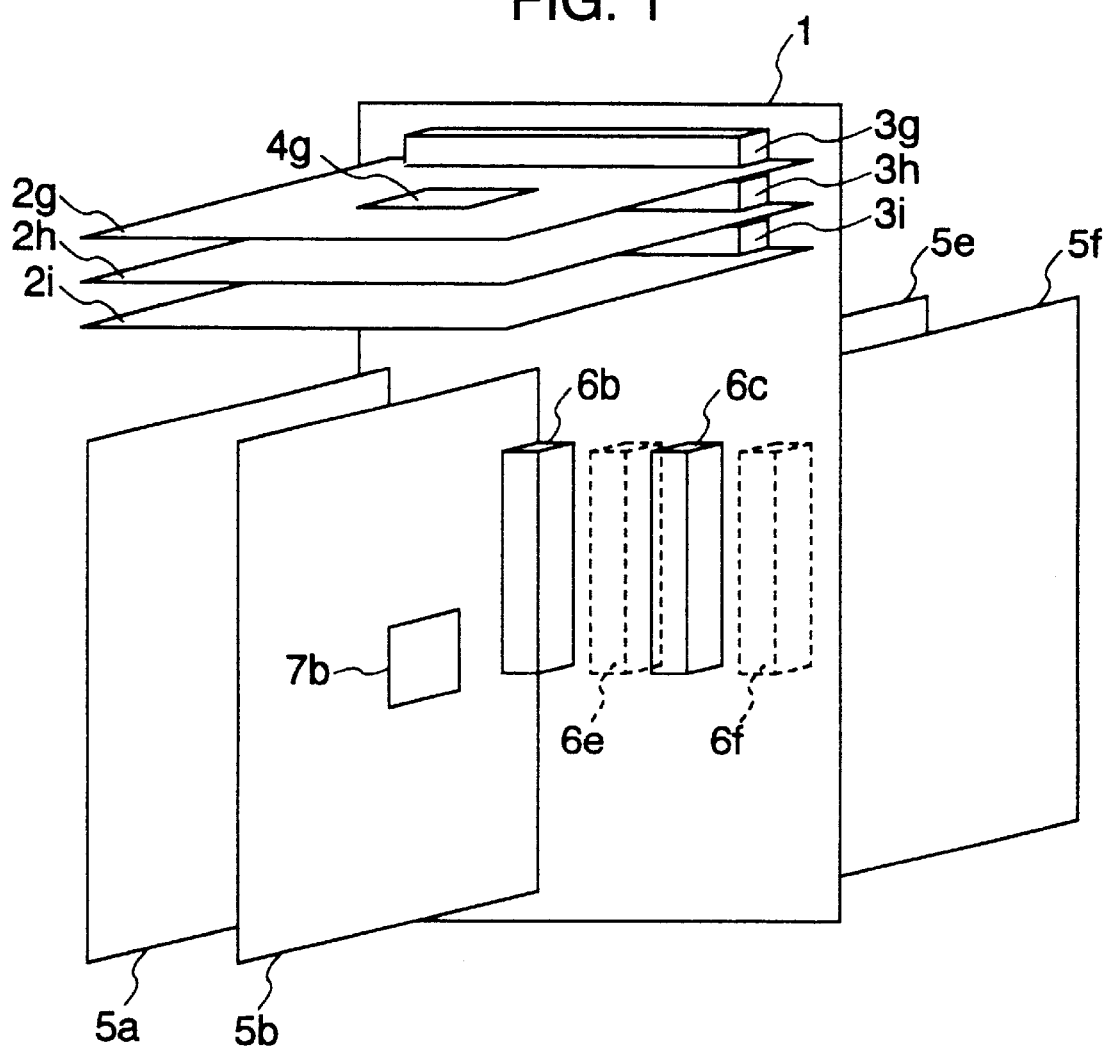
FIG. 1 is a diagram showing a first embodiment of the present invention.
Figure 2:
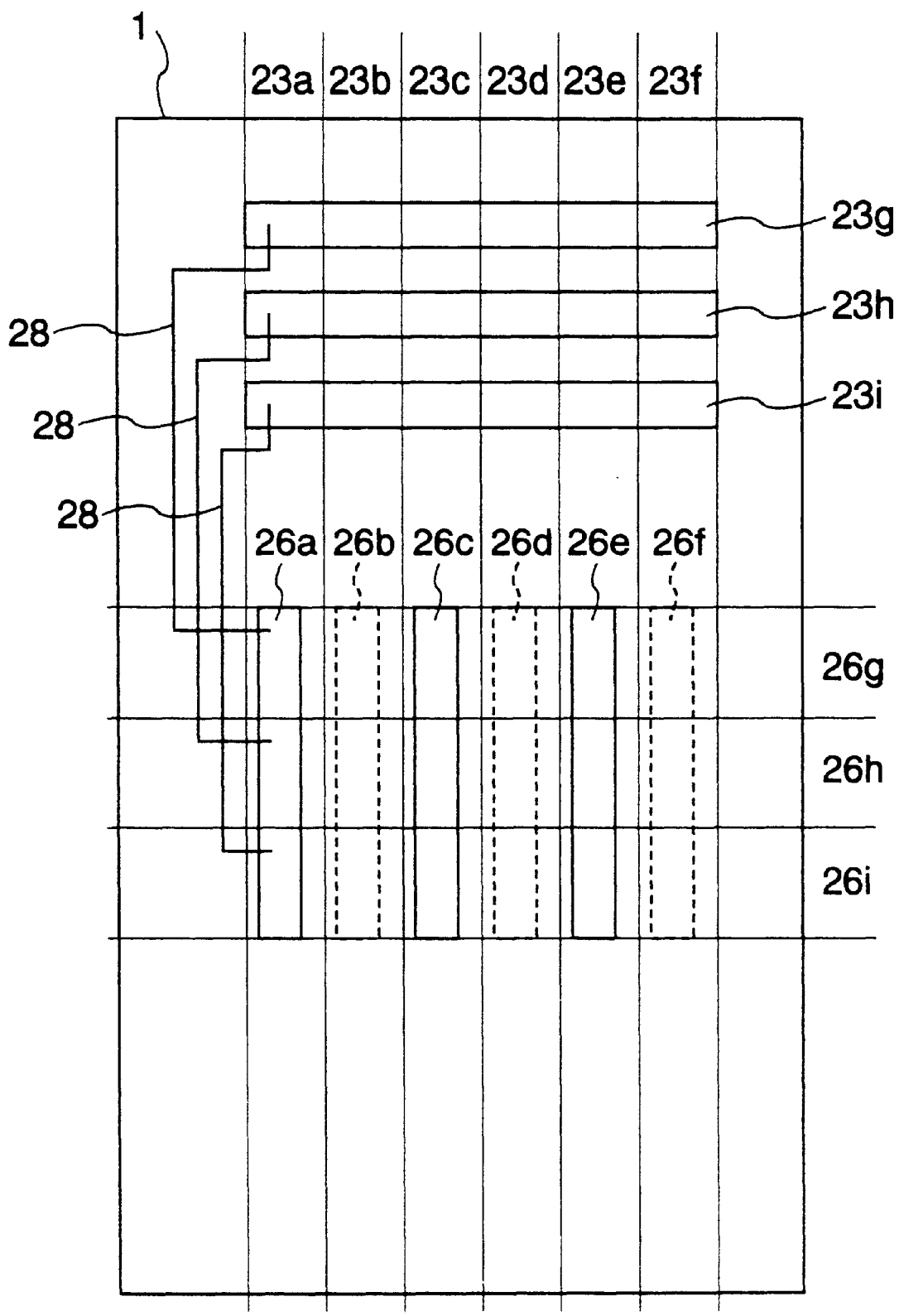
FIG. 2 is a diagram showing details of a backplane in FIG. 1.

FIG. 1 shows a first embodiment of the present invention, in which the man-hours for design of equilong wiring on the backplane are minimal. In FIG. 1, reference numeral 1 denotes a backplane, and 2g to 2i denote interconnecting boards. Numeral 4g denotes an interconnecting LSI to be mounted on the interconnecting board 2g. FIG. 1 shows the interconnecting LSI as a single LSI, but this interconnecting LSI may be formed of two or more LSI's. The same interconnecting LSI's as the one 4g are mounted on the interconnecting boards 2h, 2i. The interconnecting LSI's are formed of transistors or the like for bus, ring, and switch connections. Numerals 3g to 3i denote connectors for connecting the interconnecting boards 2g to 2i with the backplane 1, and connectors 23g to 23i of the backplane 1 in FIG. 2 are connected with connectors 53 of the interconnecting boards 2 as shown in FIG. 5. Numerals 5a, 5b, 5e and 5f denote the logic boards, such as a processor, a memory, an I/O device, etc. Numeral 7b denotes a logic LSI mounted on the logic board 5b. Similarly, one logic LSI each is also mounted on the logic boards 5a, 5e and 5f. As with the interconnecting LSI 4g, the logic LSI 7b may be formed of two or more LSI's. A connector 6b connects the logic board 5b with the backplane 1. The logic board 5a is also connected to the backplane 1 by a similar connector. The logic boards 5e, 5f are connected by connectors 6e, 6f to the reverse side of the backplane. Though the connector 6c is not connected to a logic board in FIG. 1, a logic board is connectable to the connector 6c. Thus, the connectors 6b, 6c, 6e, 6f are connected by connectors 46 (FIG. 4) of the logic boards 5 to the connectors 26a to 26f of the backplane 1. In the present embodiment, the interconnecting boards 2g to 2i in horizontal positions are connected to the backplane 1, the logic boards 5a, 5b, 5e, 5f in vertical positions are connected from both sides to the backplane 1, and all the logic boards 5a, 5b, 5e, 5f are arranged at equal distances from the interconnecting boards 2g to 2i. In this case, the logic boards 5a, 5b, 5e, 5f are connected to both sides of the backplane 1, but may be connected only to one side of the backplane 1. Another structure can be formed such that the interconnecting LSI's are directly soldered to the backplane without providing the interconnecting boards. However, this structure lacks reliability, because the backplane may be warped when the logic boards are mounted or removed, with the result of the solder being damaged. In the present embodiment, such a problem does not arise since the interconnecting boards are connected to the backplane by means of the connectors. If solderless press-fit connectors are used, the backplane is free from the problem of solder and its reliability is improved.

Figure 3:
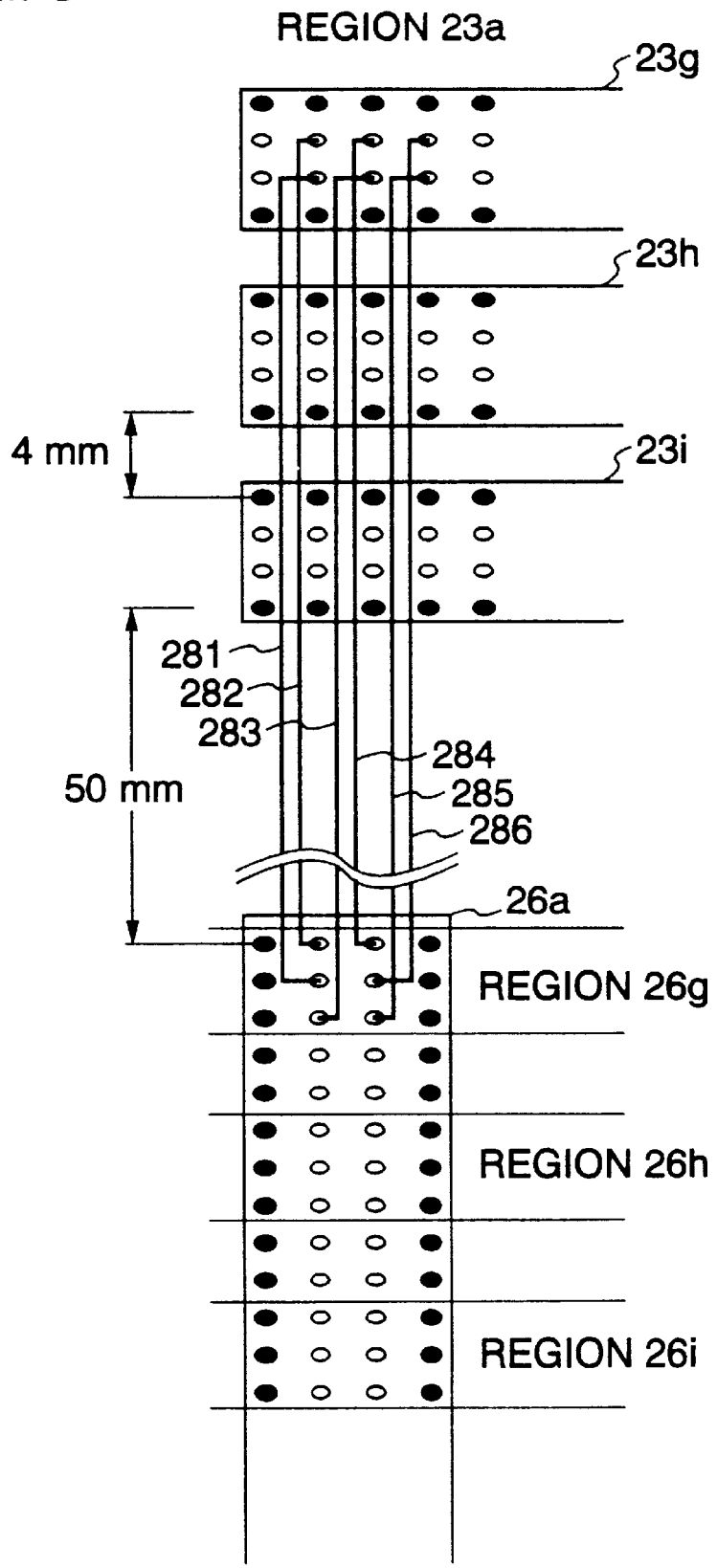
FIG. 3 is a diagram showing wiring of the backplane in FIG. 2.

FIG. 2 shows details of the backplane 1. In FIG. 2, numeral 1 denotes the backplane, 23g to 23i denote connectors for the interconnecting boards, 26a to 26f denote connectors for connecting the logic boards, and 28 denotes wires interconnecting the connectors 23g to 23i and the connector 26a. The connectors 26a to 26f are divided into three regions 26g to 26i, the same number as the number of the interconnecting boards. The connectors 23g to 23i are divided into six regions 23a to 23f, the same number as the number of logic boards. The connector pins of the regions 26g to 26i are distribute signals to the connector pins of the connectors 23g to 23i. The connector pins of the regions 23a to 23f distribute signals to the connector pins of the connectors 26a to 26f. The connections between the regions will be described by referring to the connections between the connector 26a and the connectors 23g to 23i. The region 26g of the connector 26a is connected to the region 23a of the connector 23g, and the region 26h of the connector 26a is connected to the region 23a of the connector 23h, and the region 26i of the connector 26a is connected to the region 23a of the connector 23i, respectively, by using wires of almost the same length 28. If the number of signals to be input to or output from a logic board is 8 bytes (64 bits), the number of wires 28 between the regions is 21 to 22 each. Description will be made in detail of wires strung between the region 26g of the connector 26a and the region 23a of the connector 23g by referring to FIG. 3. FIG. 3 is a diagram showing an example of wiring on the backplane, in which there are four rows of pins each of the connectors 23g to 23i, and 26a, and six wires are connected between the regions. The white dots are signal pins, the black dots are power pins, and the power pins are directly connected to the power layer of the backplane. Numerals 281 to 286 denote the wires 28 in FIG. 2. The wires of X directions and Y directions are placed in different wiring layers. Supposing that the space between the connectors 23g to 23i for connecting the interconnecting boards is 4 mm, the space between the connector 23i and the connector 26a is 50 mm, the inter-pin distance of connectors is 2 mm, and two wires can be strung in equal distances between the pins, the wire length is 76.7 mm for wire 281, 75.3 mm for wires 282 and 284, and 78.0 mm for wires 283, 285, 286. Therefore, the difference between the maximum and minimum wire lengths is 2.7 mm, and if the propagation delay of the wires is 7 ns/m, the difference in propagation delay is not more than 20 ps. If wiring is optimized, the propagation delay can be shortened. Also for wiring between the region 26h of the connector 26a and the connector 23h and between the region 26i of the connector 26a and the connector 23i, if the relative position of the pins to be wired is the same as with the pins of the region 26g and the connector 23g and the wires are routed on wiring layers other than that for the wires 281 to 286, equilong wiring can be done merely by displacing the wires 281 to 286 in the vertical direction. Further, for wiring between the connectors 26b to 26f and the connectors 23g to 23i in FIG. 2, the same wiring as between the connector 26a and the connectors 23g to 23i can be applied. Specifically, if the same relative position as between the connector 26a and the connectors 23g to 23i is used for the pins to be wired, equilong wiring can be set up between the connectors only by displacing the wiring in the horizontal direction. After all, wiring of 281 to 286 can be utilized for all inter-connection wiring with the result of man-hours for design being reduced. When the connectors 26a to 26f are located in the regions 23a to 23f, the horizontal wiring length becomes minimum, so that the propagation delay from the logic boards to the interconnecting boards can be decreased. At this time, the wires on the backplane 1 extend for the most part in the vertical direction, the horizontal wires being only at the lead-out portions from the connector pins. As the result, the number of horizontal wiring layers can be reduced. By connecting the interconnecting boards and the logic boards to the backplane and dividing the connectors into proper regions as in the present embodiment, the distances between the pins can be made substantially equal, and equilong wiring can be realized easily in wiring between all logic boards and interconnecting boards.

Figure 4:
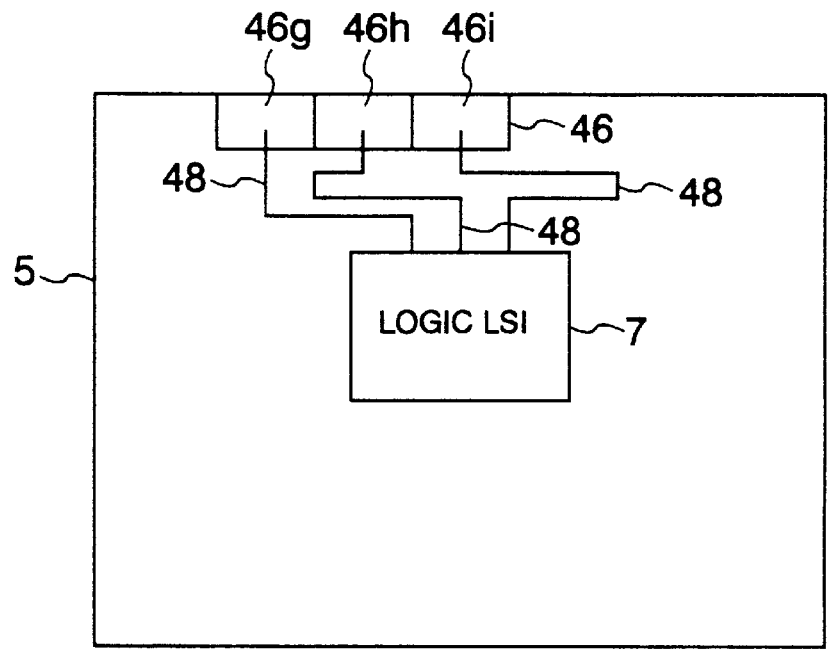
FIG. 4 is a diagram showing details of a logic board in FIG. 1.
Figure 5:
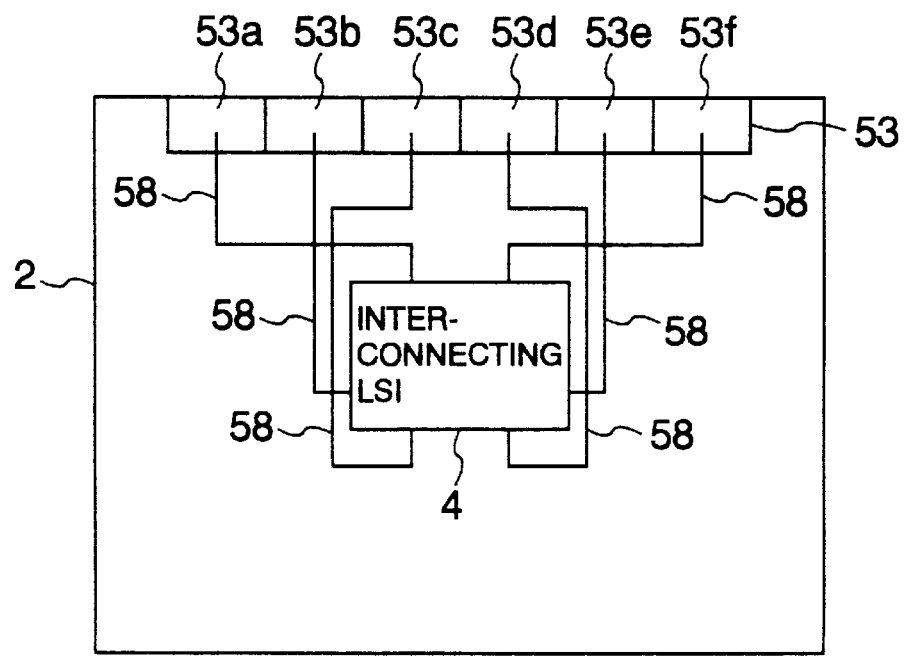
FIG. 5 is a diagram showing details or a interconnecting board in FIG. 1.

FIG. 4 shows details of the logic board. In FIG. 4, numeral 5 denotes a logic board, 46 denotes a connector, connected to the backplane, which is divided into three regions 46g to 46i like in the connectors 26a to 26f in FIG. 2. The connector 46 is connected to any of the connectors 26a to 26f in FIG. 2. Numeral 48 denotes wires connecting the regions 46g to 46i of the connector 46 with the logic LSI 7 by equilong wiring. In FIG. 4, the wires are connected to one side of LSI 7. The I/O pins of LSI 7, to which the wires 48 are connected, are divided into three regions so as to correspond to the regions 46g to 46i to facilitate installation of wires 48. If the number of signals to be input to or output from a logic board is 8 bytes (64 bits), like in the wires 28 in FIG. 2, the number of signals 48 between the regions 46g to 46i and LSI 7 is 21 to 22 each.

FIG. 5 shows details of the interconnecting board. In FIG. 5, numeral 2 denotes an interconnecting board, and 53 denotes a connector, which is connected to the backplane and divided into six regions 53a to 53f like those connectors 23g to 23i in FIG. 2. The connector 53 is connected to any of the connectors 23g to 23i in FIG. 2. Numeral 58 denotes wires connecting the regions 53a to 53f of the connector 53 with the interconnecting LSI 4 by wires of the same length. The input/output pins of LSI 4 are divided into six regions so as to correspond to the regions 53a to 53f to facilitate installation of wires 58. If the number of signals to be input to or output from one logic board is 8 bytes (64 bits), like in the wires 28 in FIG. 2, the number of signals between the regions 53a to 53f and LSI 4 is 21 to 22 each.

Figure 6A:
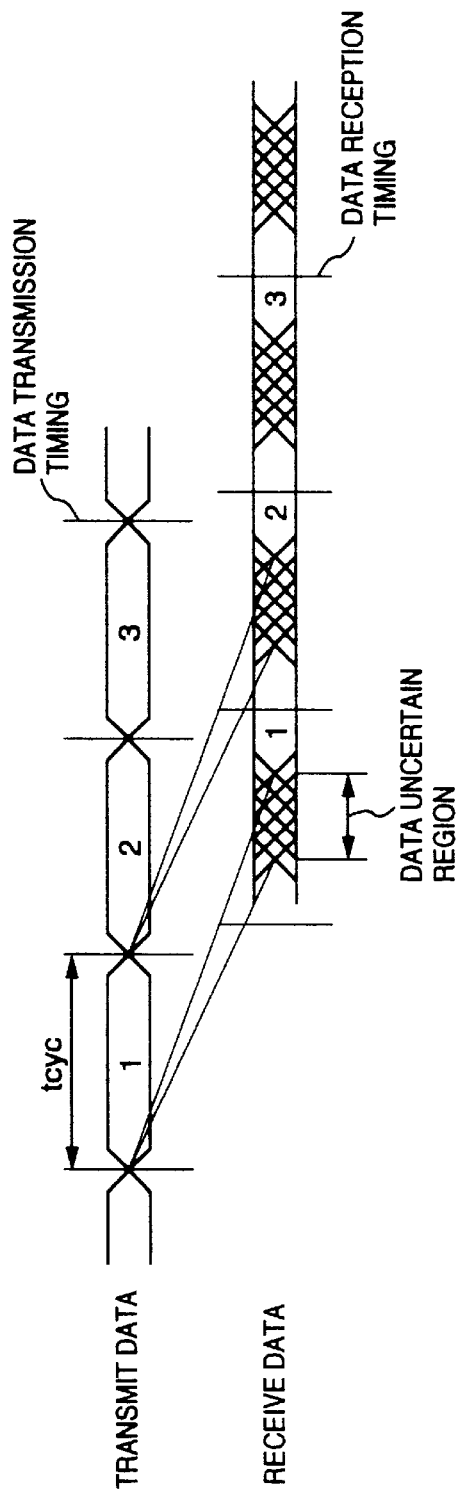
FIG. 6A is a diagram for explaining the relation between a propagation delay and a transfer period when propagation times are substantially equal.
Figure 6B:
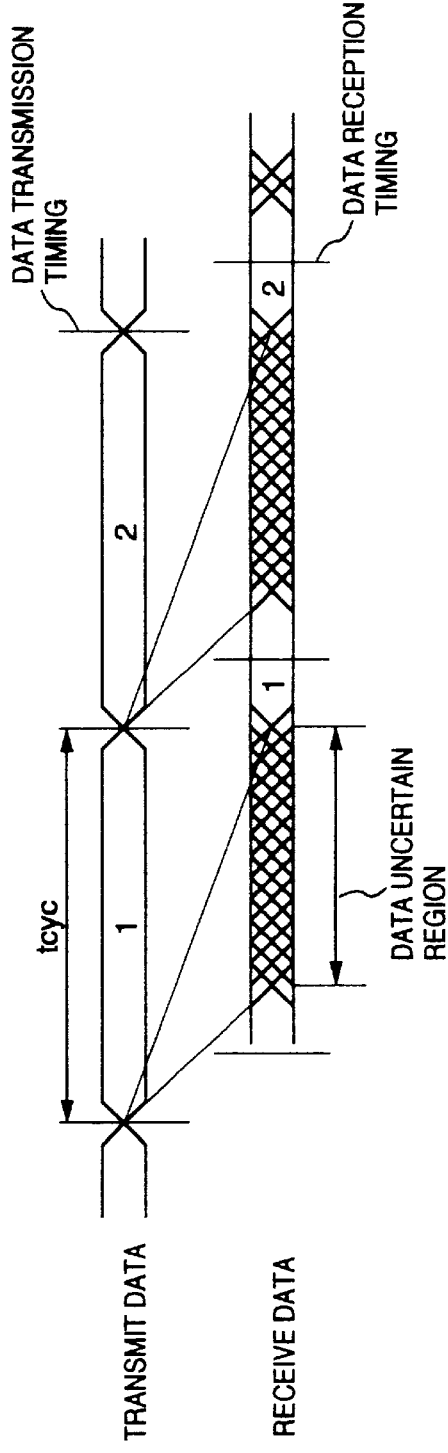
FIG. 6B is a diagram for explaining the relation between a propagation delay and a transfer period when propagation times are not equal.
Figure 7:
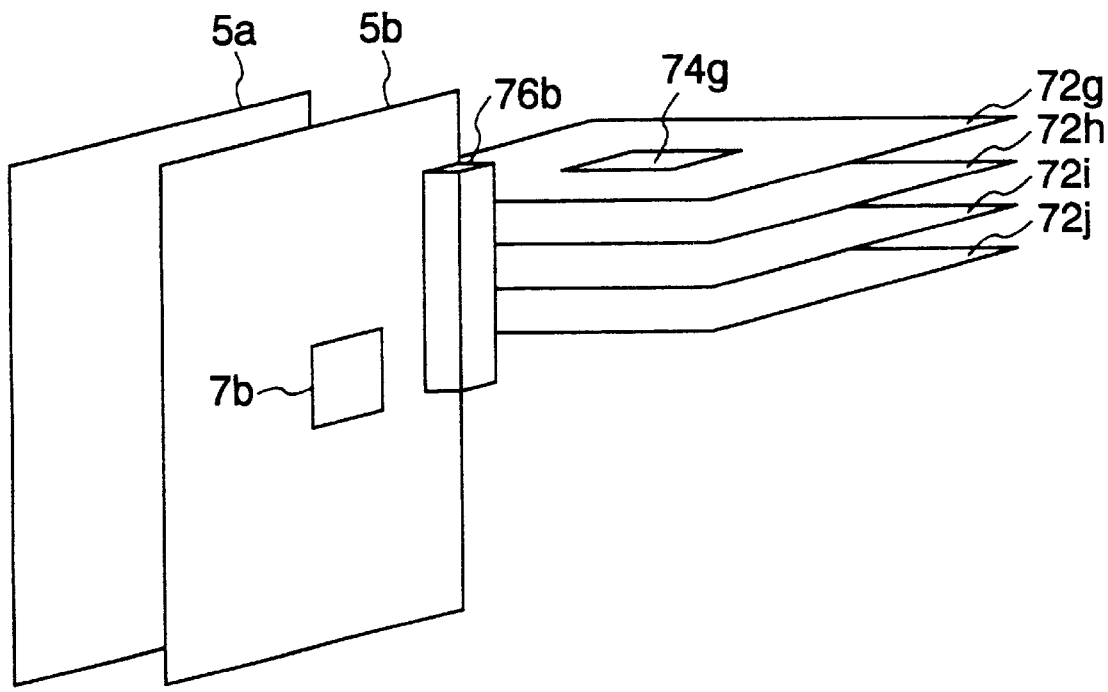
FIG. 7 is a diagram showing an example of the prior-art apparatus.

Taking data transfer from the logic boards to the interconnecting boards as an example, description will be made of data transfer under two different conditions, that is, when the propagation delays are substantially equal by referring to FIG. 6A and when the propagation delays are not equal by referring to FIG. 6B. Transmit data is data several bytes long output by the logic LSI on the logic board, and variations hardly occur in propagation delay among individual pieces of transmit data. Receive data is data input into the switch LSI on the interconnecting board, and variations occur in propagation delay among different pieces of receive data owing to variations in wiring length on the logic boards, the backplane or the interconnecting boards. The switch LSI needs to receive data during a period between the arrival of all bits of the first data and the arrival of the first portion of the second data in FIGS. 6A and 6B. When propagation delays are not equal among different pieces of data, there is a large data uncertain region due to differences in propagation delay compared with a data uncertain region when propagation delays are substantially equal. In order for the switch LSI to receive correct data, it is necessary to set a greater data transfer period tcyc. Therefore, to transmit signals at high speed, it is required to equalize the propagation delay for all data. By achieving equilong wiring as in the present embodiment, the propagation delay of data between the logic boards and the interconnecting boards can be made almost equal, so that high-speed signal transmission can be carried out.

To reduce the number of interconnecting boards, it is necessary to connect the logic boards 5a, 5b, 5e, 5f and the interconnecting boards 2g to 2i to the backplane 1, and transmit signals through the wires on the backplane as shown in FIG. 1. Further, by performing equilong wiring on the logic boards, the interconnecting boards and the backplane, it becomes possible to realize cost reduction, high reliability and high-speed transmission of signals. In the present embodiment, unlike in second and third embodiments that will be described later, all logic boards are arranged equidistantly from the interconnecting boards, it is only necessary to perform equilong wiring for the logic boards, the interconnecting boards, and the backplane. Wiring of the backplane is systematic work, and therefore man-hours for design of equilong wiring are reduced to a minimum.

Figure 8:
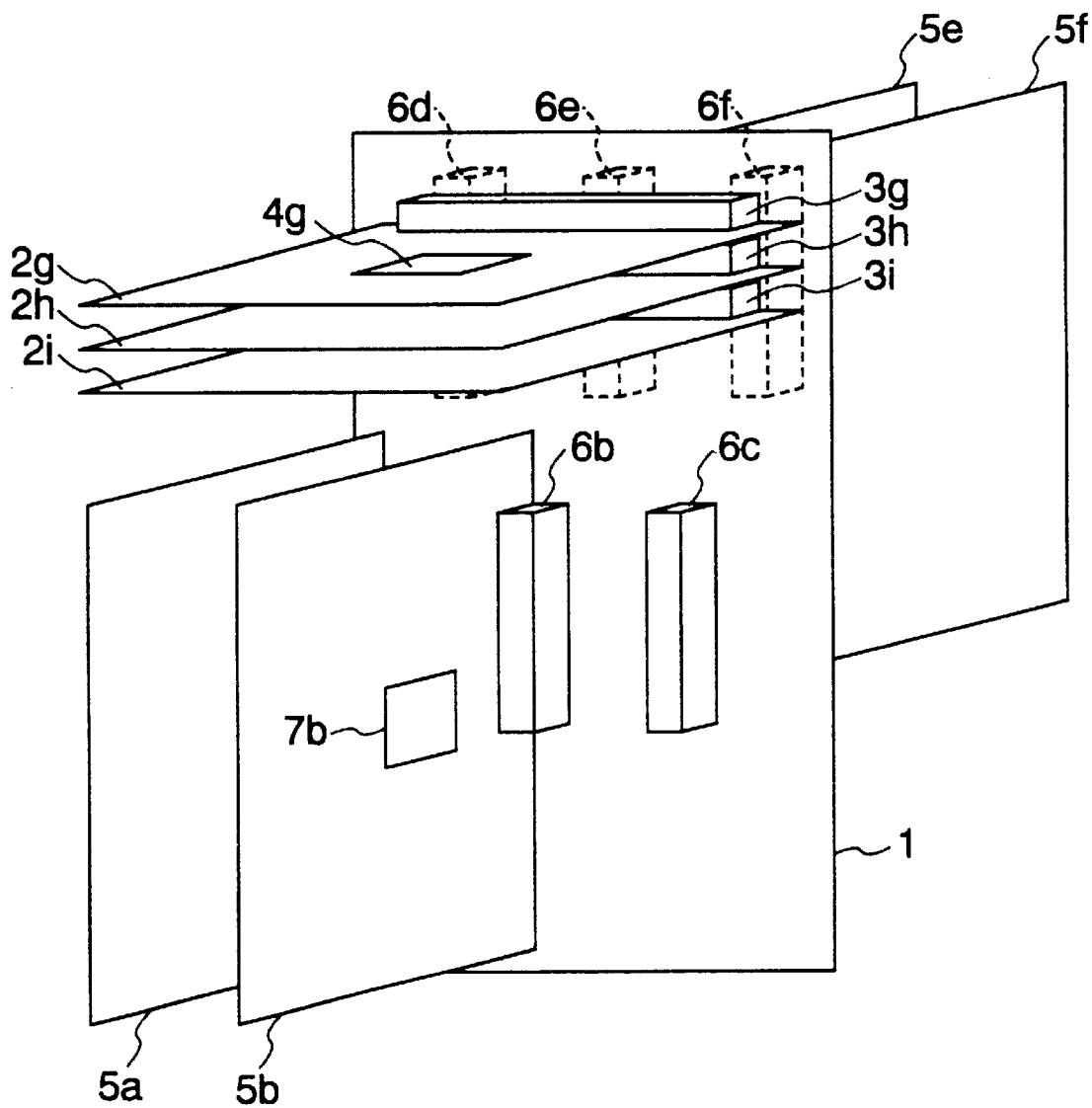
FIG. 8 is a diagram showing a second embodiment of the present invention.

FIG. 8 is a diagram showing a second embodiment of the present invention. Even when the number of wiring layers of the backplane is small, equilong wiring is possible. In FIG. 8, numeral 1 denotes a backplane, 2g to 2i denote interconnecting boards, 4g denotes an interconnecting LSI mounted on an interconnecting board 2g, and one each of this LSI is also mounted on the interconnecting boards 2h and 2i. Numerals 3g to 3i denote connectors for connecting the interconnecting boards 2g to 2i to the backplane 1. Numerals 5a, 5b, 5e, 5f denotes logic boards, 7b denotes a logic LSI mounted on the logic board 5b, and a similar LSI is also mounted on each of the logic boards 5a, 5e, 5f. Numeral 6b denotes a connector connecting the logic board 5b to the backplane 1, and the logic board 5b is also connected by a connector to the backplane 1. Numeral 6b denotes a connector connecting the logic board 5b to the backplane 1, and the logic board 5a is likewise connected by a connector to the backplane 1. The logic boards 5e, 5f are connected to the reverse side of the backplane 1 by connectors 6e, 6f. Though logic boards are not connected to the connectors 6c, 6d, logic boards can be connected to those connectors like the other connectors. In FIG. 1, all the logic boards 5a, 5b, 5e, 5f are arranged equidistantly from the interconnecting boards 2g to 2i, whereas in FIG. 8 the logic boards 5e, 5f are connected to the side of the backplane opposite the side where the interconnecting boards 2g to 2i are provided, and the connectors are at right angles with the connectors 3g to 3i. Wiring between the logic boards 5e, 5f and the interconnecting boards 2g to 2i is carried out as follows. If the number of signals input from and output to a logic board is 8 bytes (64 bits), the number of signals from the logic boards 5e, 5f to the interconnecting boards 2g to 2i is 21 to 22 each. If the number of signals directly connected by the pins at intersections of the connectors is four, the remaining 17 to 18 signals are connected by using the connector pins other than at the intersections, and also using the wires on the backplane. The wires on the backplane at this time represent wiring length differences because the wiring length on the backplane is zero where direct pin connection is done at the intersections of the connectors. Therefore, when wiring the interconnecting boards 2g to 2i or the logic boards 5e, 5f, by setting a longer length of wire for direct pin connections at the intersections of the connectors and also by setting a shorter length of wire for wiring through the backplane, the wiring length differences are lessened, so that equilong wiring is performed between the interconnecting boards and the logic boards. Wiring between the logic boards 5a, 5b and the interconnecting boards 2g to 2i is carried out in the same way as wiring between the logic boards and the interconnecting boards in the first embodiment. By the wiring described above, the wiring lengths between the logic boards 5e, 5f and the interconnecting boards 2g to 2i can be equalized, and the wiring lengths between the logic boards 5a, 5b and the interconnecting boards 2g to 2i can be equalized. However, there is a difference in wiring length between the two groups. In order to obtain a uniform propagation delay between all logic boards and the interconnecting boards, the wiring length differences that occur between the logic boards are reduced in wiring of the interconnecting boards 2g to 2i or the logic boards 5a, 5b, 5e, 5f. In FIG. 8, the logic boards 5a, 5b are connected on the same side as the interconnecting boards 2g to 2i, but the logic boards 5a, 5b may be connected on the reverse side like the logic boards 5e, 5f. In the present embodiment, some of the wires connecting the logic boards and the interconnecting boards are directly connected through the connectors, with the result that the number of wires on the backplane can be reduced, and equilong wiring can be performed between the logic boards and the interconnecting boards even when there are not many wiring layers on the backplane.

Figure 9:
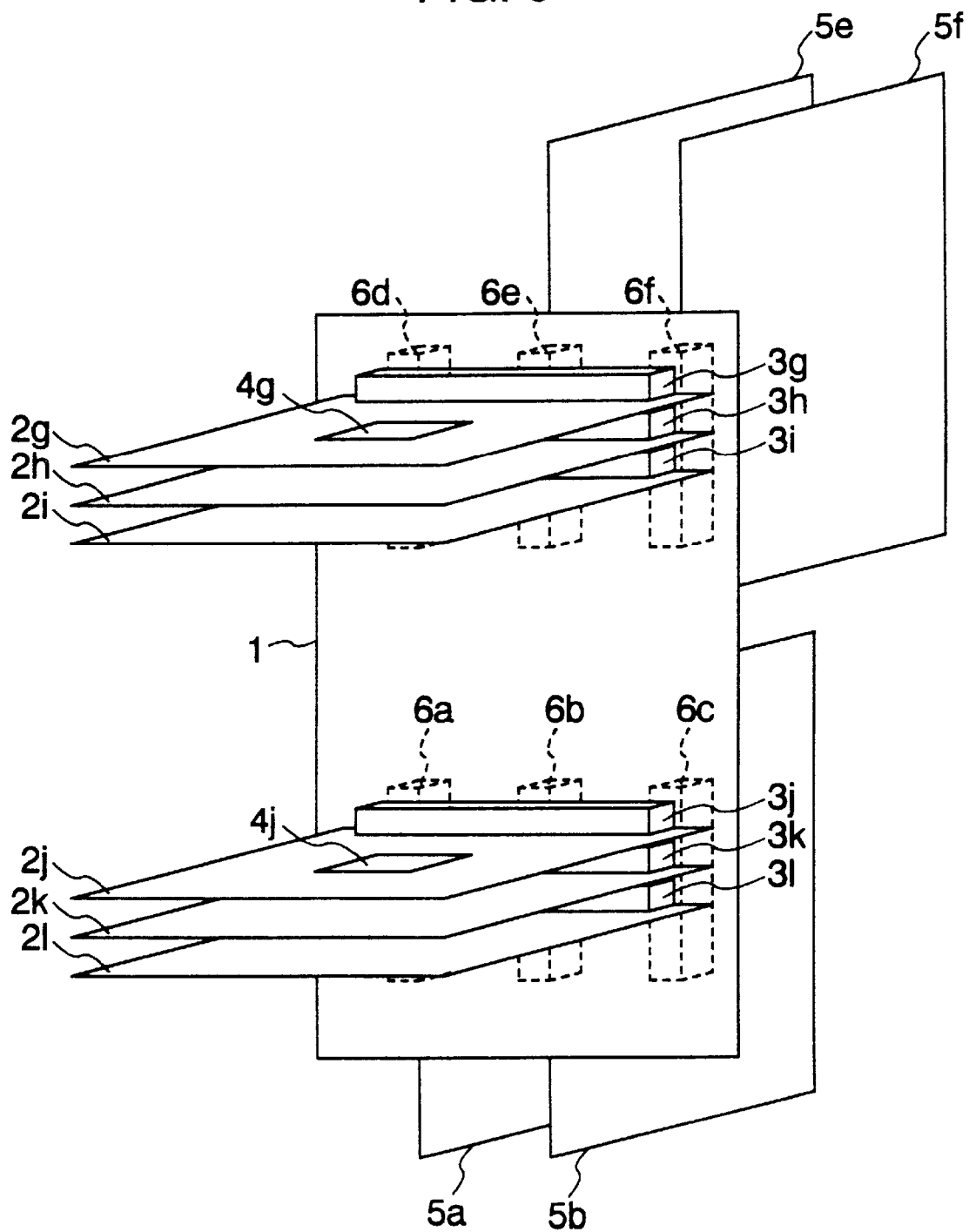
FIG. 9 is a diagram showing a third embodiment of the present invention.

FIG. 9 shows a third embodiment of the present invention. This embodiment is effective in a case where there are many signals to be exchanged between the logic boards and the interconnecting boards and there are many interconnecting boards. The same numerals as in FIG. 8 show the same parts. In FIG. 9, all logic boards are connected to the side of the backplane opposite the side where the interconnecting boards are mounted. Interconnecting boards 2j to 2l are connected to the side of the backplane opposite the side where there are the logic boards 5a, 5b. Connectors 3j to 3l connect the interconnecting boards 2j to 2l to the backplane 1. An interconnecting LSI 4j is mounted on the interconnecting board 2j. Wiring between the logic boards 5e, 5f and the interconnecting boards 2g to 2i and wiring between the logic boards 5a, 5b and the interconnecting boards 2j to 2l are the same as wiring between the logic boards 5e, 5f and the interconnecting boards 2g to 2i in the second embodiment. Wiring between the logic boards 5e, 5f and the interconnecting board 2j to 2i and wiring between the logic boards 5a, 5b and the interconnecting boards 2g to 2i are the same as wiring between the logic boards 5a, 5b and the interconnecting boards 2b to 2i in the second embodiment. In the third embodiment, like in the second embodiment, some of the wires between the logic boards and the interconnecting boards are directly connected through the connectors. Therefore, the number of wires on the backplane can be reduced, and equilong wiring can be done between the logic boards and the interconnecting boards even when there are not many wiring layers on the backplane.

What is claimed is:

1. Apparatus for interconnecting logic boards, comprising:

a backplane;

a plurality of logic boards connected to said back plane; and a plurality of interconnecting boards having interconnecting LSIs, respectively, said plurality of interconnecting boards being connected to said backplane, disposed vertically to said logic boards, and interconnecting said logic boards.

2. Apparatus for interconnecting logic boards according to claim 1, wherein said logic boards are connected to said backplane at a specified distance away from said interconnecting boards.

3. Apparatus for interconnecting logic boards according to claim 1, wherein a plurality of wires connecting said logic boards and said interconnecting boards are substantially equal in length.

4. Apparatus for interconnecting logic boards according to claim 1, wherein said logic boards are connected to said backplane at a specified distance.

5. Apparatus for interconnecting logic boards according to claim 1, wherein connectors for connecting said interconnecting boards and said backplane are divided into first regions of a number of said logic boards, and said connectors are allotted to said first regions in an order of said logic boards, and connectors for connecting said logic boards and said backplane are divided into second regions of a number of said interconnecting boards, and said connectors are allotted to said second regions in an order to said interconnecting boards, and regions of connectors of said interconnecting boards and regions of connectors of said logic boards which correspond each other are connected by wires on said backplane.

6. Apparatus for interconnecting logic boards, comprising:

a backplane;

a plurality of logic boards connected to said back plane; and a plurality of interconnecting boards connected to said backplane, disposed vertically to said logic boards, and interconnecting said logic boards;

a semiconductor integrated circuit device disposed on said interconnecting board, wherein connectors for connecting said interconnecting boards and said backplane are divided into connector regions of a number of said logic boards, and input and output pins of said semiconductor integrated circuit device are divided into input/output pin regions of a number of connector regions, and said connector regions and said input/output pin regions are connected by wires on said interconnecting board.

7. Apparatus for interconnecting logic boards, comprising:

a backplane;

a plurality of logic boards connected to said backplane; and a plurality of interconnecting boards having interconnecting LSIs, respectively, said plurality of interconnecting boards connecting said plurality of logic boards connected to said backplane, wherein a signal is transmitted through pins of connectors disposed at positions other than where said logic boards and said interconnecting board intersect each other.

8. Apparatus for interconnecting logic boards according to claim 7, wherein said logic boards are connected to said backplane in a vertical direction to said interconnecting boards.

9. Apparatus for interconnecting logic boards according to claim 7, wherein said logic boards are connected to said backplane at a specified distance.

10. apparatus for interconnecting logic boards, comprising:

a backplane;

a plurality of logic boards connected to said backplane; and a plurality of interconnecting boards having interconnecting LSIs, respectively, said plurality of interconnecting boards connected to said backplane and connecting with said plurality of logic boards, wherein a connection direction of said logic boards and a connection direction of said interconnecting boards are different from a connection direction to said backplane.

* * * * *